United States Patent
Shiobara

(10) Patent No.: US 6,537,460 B1
(45) Date of Patent: Mar. 25, 2003

(54) METHOD FOR DETECTING AN END POINT OF ETCHING IN A PLASMA-ENHANCED ETCHING PROCESS

(75) Inventor: Toshitaka Shiobara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/597,937

(22) Filed: Jun. 20, 2000

(30) Foreign Application Priority Data

Jun. 21, 1999 (JP) .......................... 11-173619

(51) Int. Cl.[7] .................. G01L 21/30; H01L 21/302
(52) U.S. Cl. .................. 216/60; 216/59; 438/14; 438/16
(58) Field of Search .................. 216/59, 60; 438/14, 438/16

(56) References Cited

U.S. PATENT DOCUMENTS

| 4,317,698 A | * 3/1982 | Christol et al. ............ 216/60 |
| 4,615,761 A | 10/1986 | Tada et al. |
| 5,702,562 A | * 12/1997 | Wakahara .................. 216/60 |
| 5,730,834 A | * 3/1998 | Gabrial .................... 216/67 |
| 5,801,101 A | * 9/1998 | Miyoshi ................... 438/714 |

FOREIGN PATENT DOCUMENTS

| JP | 59-94423 | 5/1984 |
| JP | 60-098631 | 6/1985 |
| JP | 61-053728 | 3/1986 |
| JP | 62-159431 | 7/1987 |
| JP | 5-283373 | 10/1993 |
| JP | 07-122542 | 5/1995 |
| JP | 07-130709 | 5/1995 |
| JP | 08-130206 | 5/1996 |

* cited by examiner

Primary Examiner—Randy Gulakowski
Assistant Examiner—Shamim Ahmed

(57) ABSTRACT

In a plasma-enhanced etching process, the end point of the etching is detected based on the light intensity of the plasma and the second derivative of the light intensity. First, magnitude of the light intensity is judged based on a threshold to determine whether the etching area ratio is large or small with respect to the total area. Then, the second derivative of the light intensity is calculated after selecting sampling time interval based on the judgement of the etching area ration. The end point is detected when the second derivative assumes zero after exceeding a threshold in the absolute value thereof.

8 Claims, 5 Drawing Sheets

METHOD FOR DETECTING AN END POINT OF ETCHING IN A PLASMA-ENHANCED ETCHING PROCESS

BACKGROUND OF THE INVENTION (a) Field of the Invention

The present invention relates to a method for detecting an end point of etching in a plasma-enhanced etching process and, more particularly, to a technique for detecting an end point of etching in a gas-plasma-enhanced etching process by using a spectrum analyzing technique.

(b) Description of the Related Art

A gas-plasma-enhanced etching technique is known as one of dry etching techniques used in fabrication of semiconductor devices. FIG. 1 shows a typical plasma-enhanced etching system having a pair of parallel planar electrodes.

The parallel planar electrodes include a cathode 12 connected to a high-frequency power source 14, and an anode 13 connected to the ground, both of which are disposed in a reaction chamber 11. A semiconductor wafer 15 is mounted on the surface of the cathode 12. Etching gas is introduced through a gas inlet port 16 into the reaction chamber 11, and subjected to plasma-excitation by a high-frequency power between the cathode 12 and the anode 13 to generate gas plasma 17. The gas plasma 17 thus generated etches the surface of the semiconductor wafer 15 in a dry etching process. The reacted gas generated in the reaction chamber 11 by chemical reaction is exhausted through a gas outlet port 18 from the reaction chamber 11.

The reaction chamber 11 has a quartz window 19 for monitoring the light intensity of plasma with respect to elapsed time, which is subjected to a variety of data processing such as calculation of a second derivative (second order differential) of the light intensity.

An end point of the etching is generally determined based on the measurement of the light intensity by using a spectrum analyzing technique and the data processing thereof. Patent Publication JP-A59-94423 describes a technique for detecting the end point of the etching, wherein the end point is determined based on a second derivative of the light intensity of the plasma in the reaction chamber calculated with respect to time. More specifically, the end point is detected at the timing when the second derivative assumes zero after exceeding a threshold in the absolute value thereof.

FIG. 2 shows two different curves (curves "A" and "B") of the light intensity generated by the plasma-enhanced etching, whereas FIGS. 3A and 3B show second derivative curves for the light intensity curves "A" and "B", respectively, shown in FIG. 2. The two light intensity curves "A" and "B" are obtained, for example, by etching an aluminum film on a semiconductor wafer to form interconnect patterns for about one minute.

The curve "A" in FIG. 2 is obtained in the case of etching a larger area ratio, such as 60% of the etching area to the total area, whereas the curve "B" is obtained in the case of etching a smaller area ratio, such as 20% of the etching area to the total area.

As shown in FIG. 2, if the etching area ratio is large, a larger etching time is needed, with the light intensity being maintained at a high level during the etching and the reduction of the light intensity being steep at the end point of the etching. On the other hand, if the etching area ratio is small, a smaller etching time is needed, with the light intensity being maintained at a lower level during the etching and the reduction of the light intensity being moderate at the end point of the etching.

As a result, the second derivative, as shown in FIG. 3A, for the curve "A" eventually exceeds a threshold "a" in the absolute value thereof for effectively informing the end point of the etching, whereas the second derivative, as shown in FIG. 3B, for the curve "B" does not exceed the threshold "a" in the absolute value thereof and thus does not effectively informing the end point.

In the dry etching process using the plasma-enhanced etching technique in general, the control of the etching speed, in-plane uniformity of the etching and the dimensions or shape of the profile in the etched film has become more and more difficult to achieve. This is partly because of the difference in the etching area together with the smaller process margin in the fabrication steps. The smaller process margin is more and more noticeable along with the smaller design rule and higher performance required for the semiconductor devices.

In the above situations, it is difficult to effectively detect the end point of the etching if, for example, different products having different etching areas are etched in a single etching step. This reduces the yield of the products, or the ratio of the number of good products to the number of the total products, and raises the costs for the products. Thus, it is desired to effectively detect the end point of the etching in the plasma-enhanced etching process.

SUMMARY OF THE INVENTION

In view of the above, it is an object of the present invention to provide a method for detecting an end point of etching in a plasma-enhanced etching process, which is capable of effectively detecting the end point of the etching.

The present invention provides a method for detecting an end point of etching in a plasma-enhanced etching of a film, comprising the steps of measuring a light intensity of plasma with respect to time, determining whether or not an etching area ratio of the etching step is above a threshold based on a curve of the measured light intensity, selecting a sampling time interval based on the etching area ratio, calculating a second derivative of the light intensity by using the selected sampling time interval, and detecting an end point of the etching based on the second derivative of the light intensity.

In accordance with the method of the present invention, the second derivative of the measured light intensity exceeds the threshold in the absolute value thereof due to the selection of the sampling time interval, irrespective of the level of the light intensity itself. Thus, the time instant at which the second derivative assumes zero after exceeding the threshold can be effectively detected which indicates the end point of the etching in the plasma-enhanced etching.

The above and other objects, features and advantages of the present invention will be more apparent from the following description, referring to the accompanying drawings.

PREFERRED EMBODIMENT OF THE INVENTION

Figure 1:
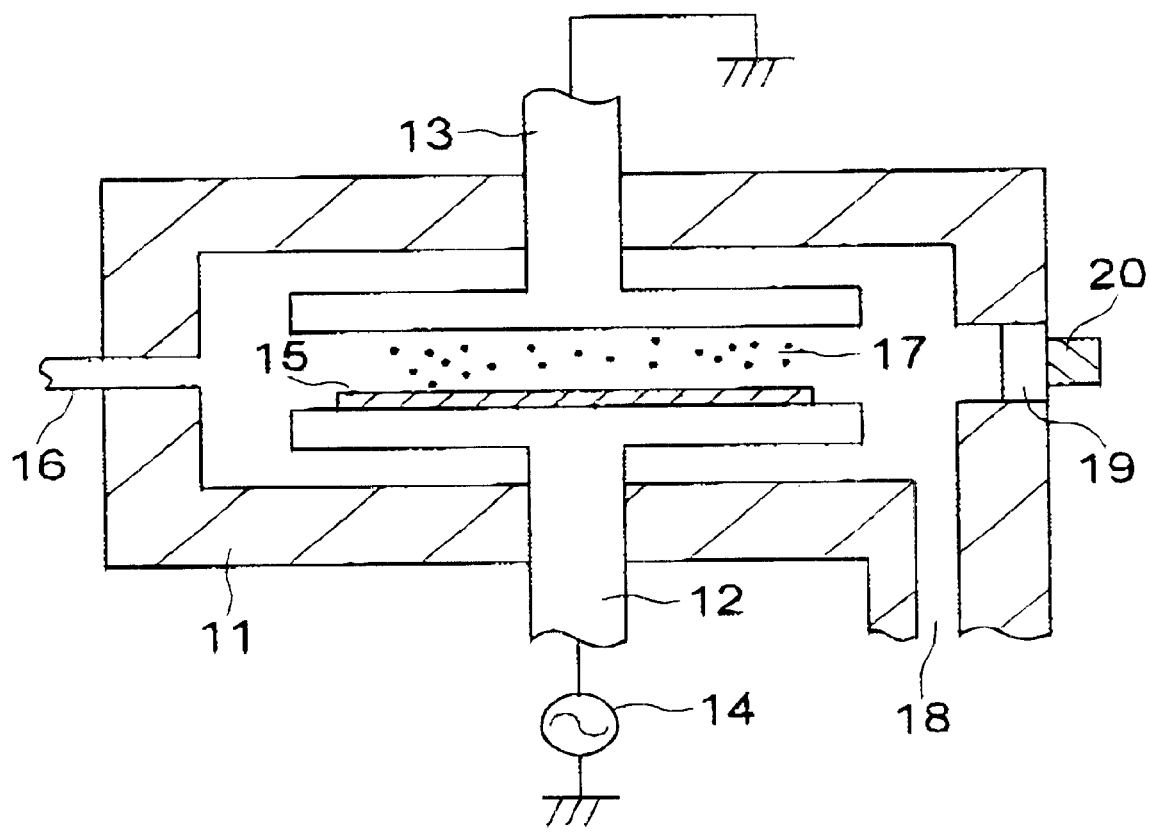
FIG. 1 is a schematic sectional view of a typical plasma-enhanced etching system.
Figure 2:
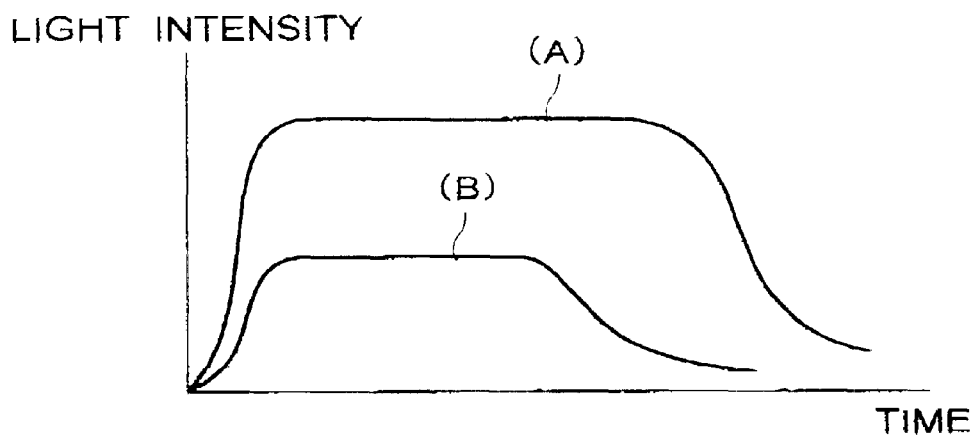
FIG. 2 is a graph for showing examples of the curve for light intensity generated in the plasma-enhanced etching process.
Figure 3A:
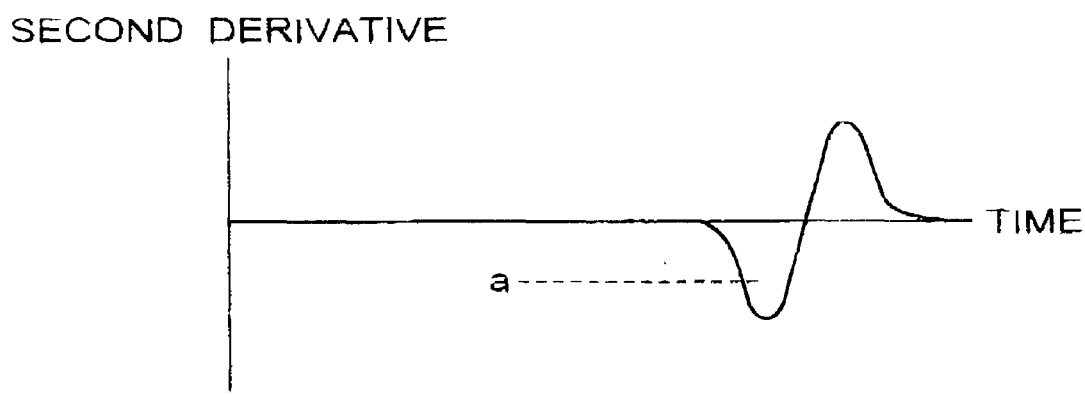
FIGS. 3A and 3B are graphs for showing second derivatives for the light intensity curves shown in FIG. 2.
Figure 3B:
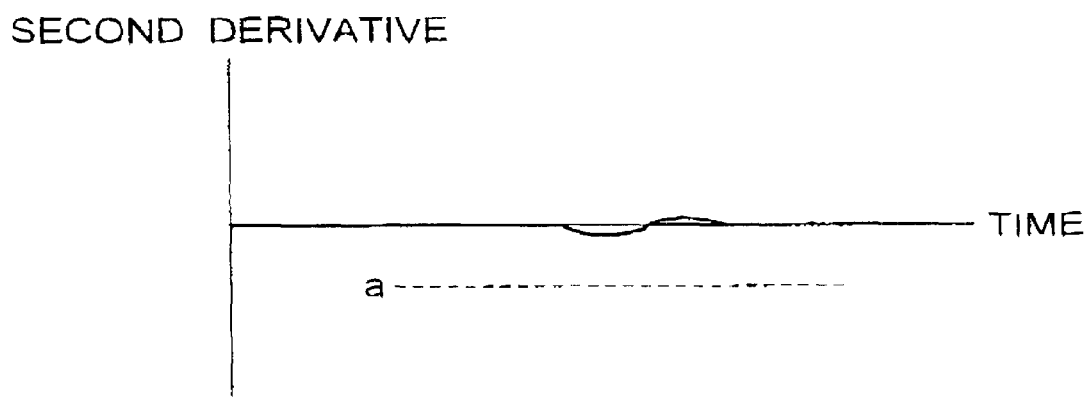

Now, the present invention is more specifically described with reference to accompanying drawings. A process according to an embodiment of the present invention is used in the plasma-enhanced etching system shown in FIG. 1.

The plasma-enhanced etching process includes the step of introducing an etching gas including a mixture of cholorine and boron trichloride into the reaction chamber 11. The inner pressure of the reaction chamber 11 is adjusted at 10 mTorr, and a high-frequency power having a frequency of 13.56 MHz is applied across the parallel planar electrodes 12 and 13. Thus, gas plasma 17 is generated between the electrodes 12 and 13, whereby an aluminum film on the semiconductor wafer 15 is etched by a dray etching technique for patterning. The aluminum etched by and reacted in the gas plasma 17 emits a plasma-enhanced light component having a wavelength of 395 nm or 308 nm, which is monitored by a photodetector 20.

Figure 4:
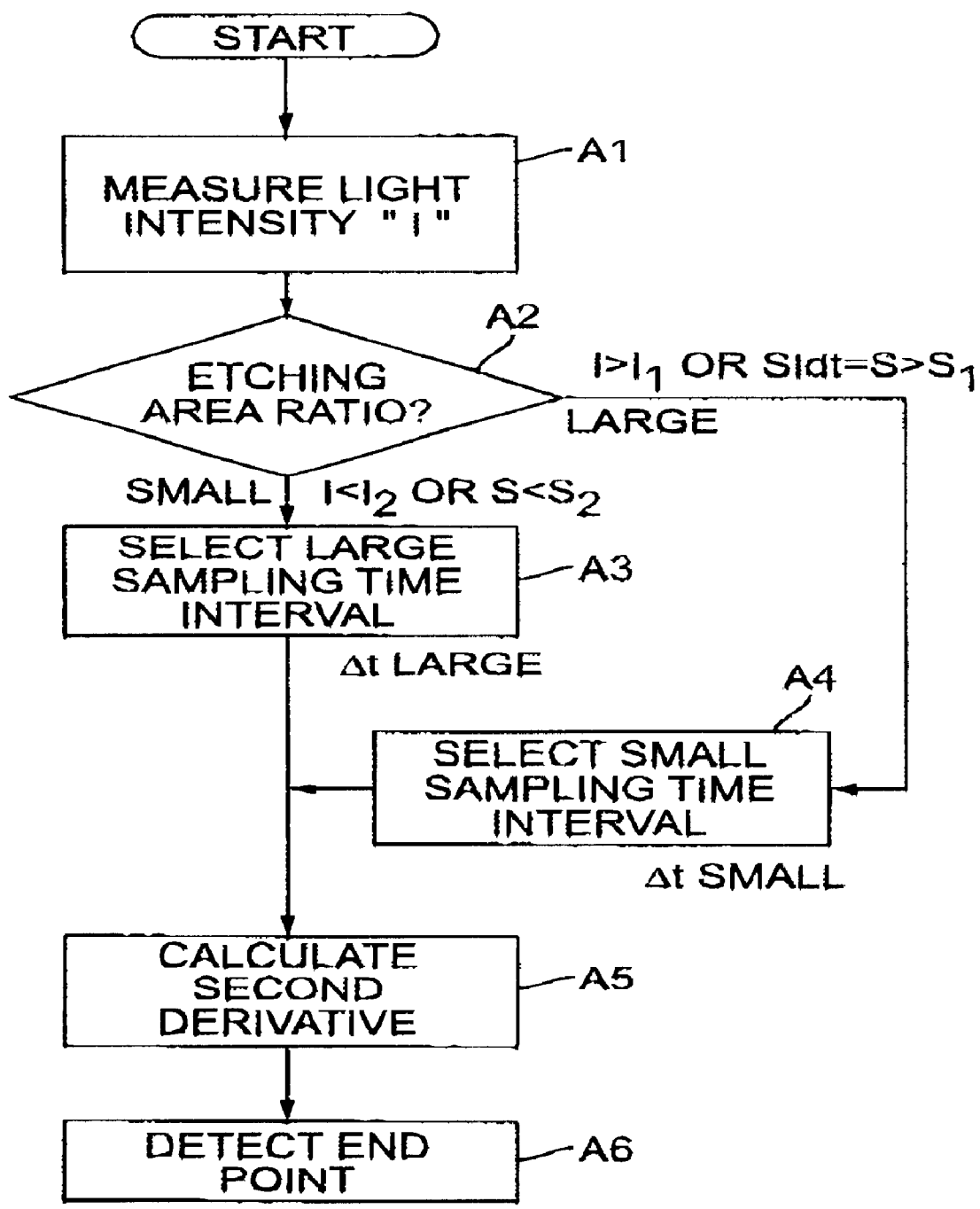
FIG. 4 is a flowchart of a process according to an embodiment of the present invention.

Referring to FIG. 4, a process according an embodiment of the present invention includes step Al, wherein the light intensity "I" of the plasma is measured during the plasma-enhanced etching. The results of measurement with respect to the etching time are exemplified in FIG. 5 by curves "A" and "B", wherein the intensities are plotted in terms of an arbitrary unit. The curve "A" corresponds to an etching area ratio of 60%, whereas the curve "B" corresponds to an etching area ratio of 20%.

Before starting the process, thresholds "I1" and "I2" for the light intensity "I" are determined such that if I>I1 then the etching area ratio is large and if I<I2 then the etching area ratio is small. In addition, thresholds "S1" and "S2" for integral "S" of the light intensity "I" ($\int Idt=S$) are determined such that if S>S1 then the etching area ratio is large, and if S<S2 then the etching area ratio is small.

In step A2, it is examined as to whether the intensity "I" is above the threshold "I1" or below the threshold "I2" at the initial stage of the etching, or at the time instant when, for example, five seconds elapsed since the start of the etching. If I>I1 is detected at the initial stage then a higher etching area ratio is detected, whereby the process advances to step A4, wherein the sampling time interval Δt for the second derivative of the light intensity "I" is set at a small value.

On the other hand, if I<I2 is detected at the initial stage then a lower etching area ratio is detected whereby the process advances to step A3, wherein the sampling time interval Δt is set at a large value.

In a practical product, if the light intensity "I" of the plasma obtained in the case of a low etching area ratio is around ½ of the reference light intensity obtained in the case of a reference etching area ratio (high etching area ratio), then the sampling time interval for the low etching area ratio should be set at 1.5 to 3.0 times the reference sampling time interval used for the reference etching area ratio.

Figure 6A:
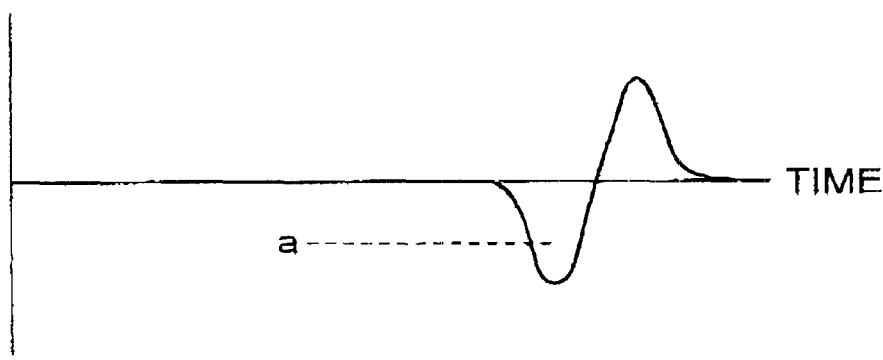
FIGS. 6A and 6B are graphs for showing second derivatives for the light intensity curves shown in FIG. 5.
Figure 6B:
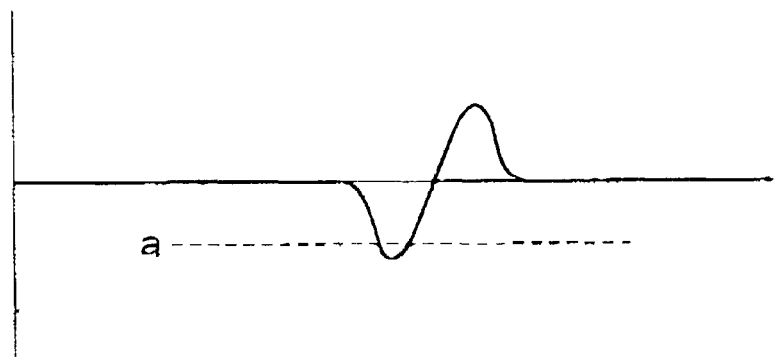

After a suitable sampling time interval for the second derivative of the light intensity is selected in step A3 or A4, the process advances to step A5, wherein the second derivative of the light intensity "I" is calculated for the case of curve "A" or "B". For the curve "A", the second derivative of the light intensity calculated using the small sampling time interval has a suitable rise which exceeds the threshold "a", as shown in FIG. 6A, due to the higher light intensity during the etching. For the curve "B", the second derivative calculated using the large sampling time interval has a suitable rise which exceeds the threshold "a", as shown in FIG. 6B, due to the large sampling time interval.

Thus, in either case, the end point of the etching is effectively detected in step A6, wherein the instant at which the second derivative assumes zero after exceeding the threshold "a" is determined as a correct end point of the etching. Thus, the etching is stopped for the aluminum film.

Back to step A2, if the light intensity measured at the initial stage, or at the time instant five seconds elapsed since the start of the etching, is between I1 and I2, then the etching area ratio cannot be determined by the light intensity "I" itself. In this case, the integral "S" of the light intensity "I" with respect to time is used for determining the etching area ratio.

Figure 5:
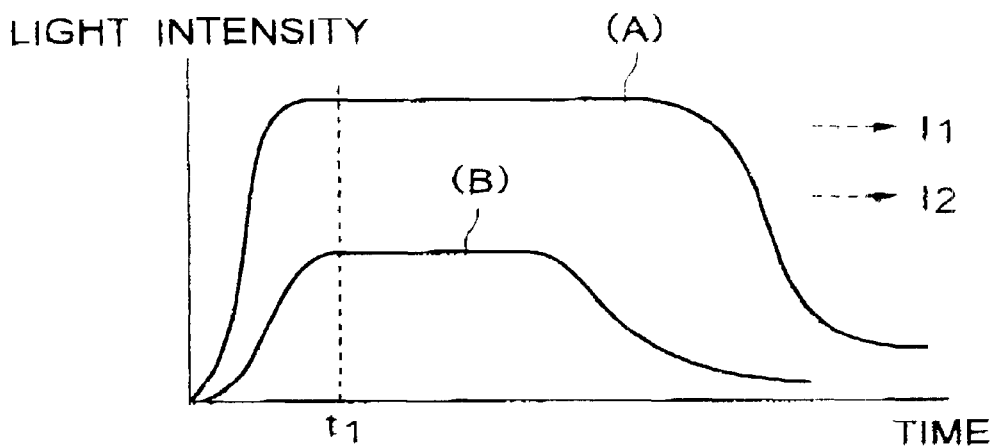
FIG. 5 is a graph for showing examples of the curve for light intensity generated in the etching process of FIG. 4.
Figure 7:
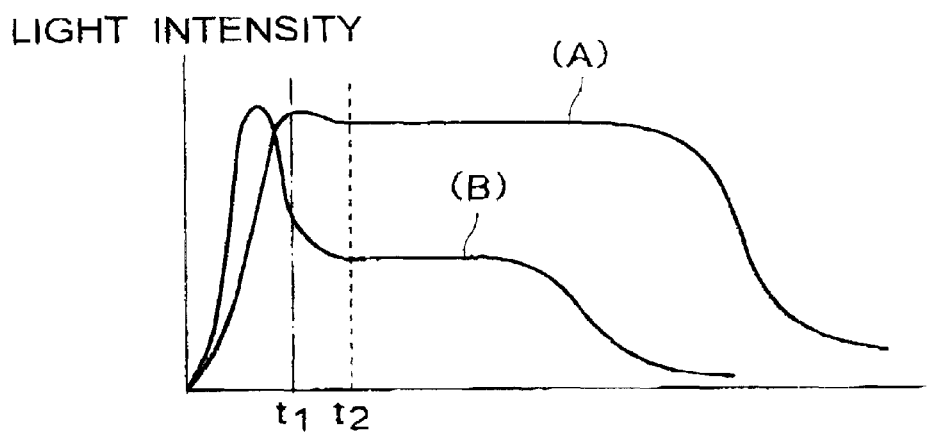
FIG. 7 is another graph for showing examples of the curve for light intensity generated in the etching process of FIG. 4.

Referring to FIG. 7, curve "A" in FIG. 7 is similar to the curve "A" in FIG. 5, whereas curve "B" in FIG. 7 is different from the curve "B" in FIG. 5. In the case of curve "B" in FIG. 7, the etching area ratio cannot be determined by the light intensity "I" which may be between "I1" and "I2" at time instant t1, or five seconds elapsed since the start of the etching. This case may occur when a mass production process is conducted wherein a large number of semiconductor devices having different structures are processed at a time in a single reaction chamber. The curve "B" corresponds to one of these cases, wherein the curve "B" includes a maximal point substantially equivalent to the maximum level of the light intensity in the curve "A", and thus it is difficult to effectively distinguish the curve "B" from the curve "A", i.e., a low etching area ratio from a high etching area ratio. The maximal point generally results from a large amount of residual gas generated in the reaction chamber in the mass production process with a smaller etching time.

In FIG. 4, if I2<I<I1 is detected at the initial stage then it is examined whether $\int Idt=S>S1$ or if $\int Idt=S<S2$. If S>S1 is detected then a large etching area ratio is determined whereby the process advances to step A4. On the other hand, if S<S2 is detected then the process advances to step A3. The remaining steps A5 and A6 are similar to those as described above, wherein the second derivative for the intensity is calculated based on the selected sampling time interval.

Figure 8A:
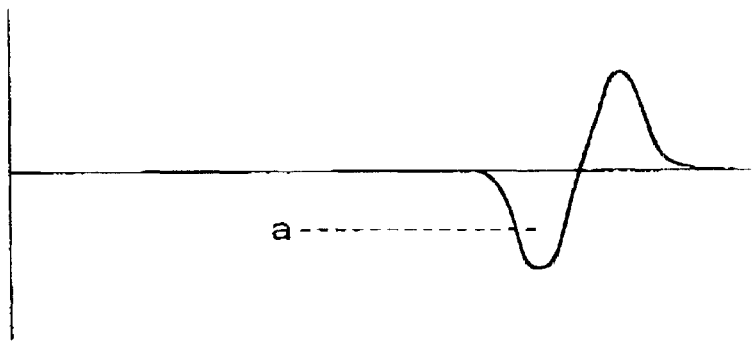
FIGS. 8A and 8B are graphs for showing second derivatives for the light intensity curves shown in FIG. 7.
Figure 8B:
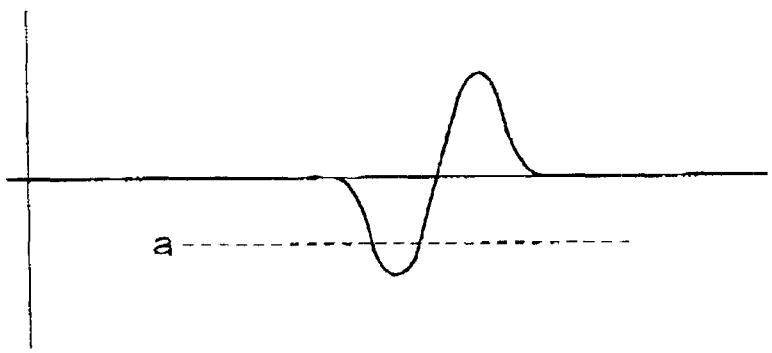

Referring to FIG. 8A, it is shown that the second derivative of the intensity "I" for the curve "A" in FIG. 7 rises above the threshold "a" in the absolute value thereof and then assumes zero to suitably indicate the end point of the etching. Similarly, as shown in FIG. 8B, it is shown that the second derivative of the intensity "I" for the curve "B" rises above the threshold "a" and then assumes zero to suitably indicate the end point.

The time length for the integration is preferably set between five seconds and ten seconds starting from the start of the etching. The end point is about one minute since the start of the etching in the case of etching an aluminum film, for example.

In the above embodiment, it is shown that the light intensity "I" is first examined and then the integral "S" is examined in step A2. However, only the integral "S" of the light intensity may be examined in step A2 in the method of the present invention without using the light intensity "I" itself.

In the above embodiment, the process is described in the case of etching an aluminum film. However, the present invention can be applied to any plasma-enhanced etching process. For example, the present invention can be applied to etching of conductive materials such as a high melting-point metal and copper. In the case of etching a high melting-point metal, for example tungsten, by a plasma-enhanced etching process using a fluorine-based material, intensity of the light component having a wavelength of 704.5 nm should be measured for detecting the end point of the etching.

In addition, the present invention is described with reference to an example wherein two thresholds are used for specifying the level for the etching area ratio. However, the number of thresholds may be one or more, depending on the number of products to be fabricated, for selecting suitable sampling time intervals. The practical values for the threshold and the sampling time intervals should be preferably determined based on the actual etching process.

Since the above embodiments are described only for examples, the present invention is not limited to the above embodiments and various modifications or alterations can be easily made therefrom by those skilled in the art without departing from the scope of the present invention.

What is claimed is:

1. A method for detecting an end point of etching in a plasma-enhanced etching of a film, comprising the steps of measuring a light intensity of plasma with respect to time, determining whether or not an etching area ratio is above a threshold based on a curve of the measured light intensity, selecting a sampling time interval based on the etching area ratio, calculating a second derivative of the light intensity by using the selected sampling time interval, and detecting an end point of the etching based on a single threshold value of the second derivative of the light intensity.

2. The method as defined in claim 1, wherein the sampling time interval is raised up to 1.5 to 3.0 times of a reference sampling time interval for a low etching area ratio if the measured light intensity is ½ of a reference light intensity corresponding to the reference sampling time interval.

3. The method as defined in claim 1, wherein said determining step is conducted based on a magnitude of the light intensity at a specified time instant.

4. The method as defined in claim 3, wherein said determining step is additionally conducted based on an integral of the light intensity with respect to time.

5. The method as defined in claim 1, wherein said determining step is conducted based on an integral of the light intensity with respect to time.

6. The method as defined in claim 5, wherein the integral of the light intensity is conducted between a start of the etching and five to ten seconds elapsed since the start of the etching.

7. The method as defined in claim 1, wherein the film is an aluminum film, and the light intensity is measured for a light component having a wavelength of 308 nm or 395 nm.

8. The method as defined in claim 1, wherein the film is a tungsten film, and the light intensity is measured for a light component having a wavelength of 704.5 nm.

* * * * *